(12) United States Patent
Kraft et al.

(10) Patent No.: US 10,968,366 B2
(45) Date of Patent: Apr. 6, 2021

(54) COMPOSITION AND METHOD FOR METAL CMP

(71) Applicant: Cabot Microelectronics Corporation, Aurora, IL (US)

(72) Inventors: Steven Kraft, Plainfield, IL (US); Fernando Hung Low, Aurora, IL (US); Daniel Clingerman, Chicago, IL (US); Roman A. Ivanov, Aurora, IL (US); Steven Grumbine, Aurora, IL (US)

(73) Assignee: CMC Materials, Inc., Aurora, IL (US)

( * ) Notice: Subject to any disclaimer, the term of this patent is extended or adjusted under 35 U.S.C. 154(b) by 0 days.

(21) Appl. No.: 16/208,742

(22) Filed: Dec. 4, 2018

(65) Prior Publication Data
US 2020/0172760 A1     Jun. 4, 2020

(51) Int. Cl.
| | | |
|---|---|---|
| C09K 3/14 | (2006.01) | |
| C09G 1/04 | (2006.01) | |
| C09G 1/02 | (2006.01) | |
| C09G 1/00 | (2006.01) | |
| H01L 21/321 | (2006.01) | |

(52) U.S. Cl.
CPC ............... *C09G 1/02* (2013.01); *C09G 1/00* (2013.01); *C09G 1/04* (2013.01); *C09K 3/1454* (2013.01); *C09K 3/1463* (2013.01); *H01L 21/3212* (2013.01); *C09K 3/1436* (2013.01)

(58) Field of Classification Search
None
See application file for complete search history.

(56) References Cited

U.S. PATENT DOCUMENTS

| | | | |
|---|---|---|---|
| 7,504,044 B2 | 3/2009 | Carter et al. | |
| 7,531,105 B2 | 5/2009 | Dysard et al. | |
| 7,846,842 B2 | 12/2010 | Carter et al. | |
| 7,994,057 B2 | 8/2011 | Dysard et al. | |
| 8,138,091 B2 | 3/2012 | Dysard et al. | |
| 8,778,211 B2 | 7/2014 | Stender et al. | |
| 9,028,572 B2 | 5/2015 | Grumbine et al. | |
| 9,127,187 B1 | 9/2015 | Grumbine et al. | |
| 9,238,754 B2 | 1/2016 | Grumbine et al. | |
| 9,303,188 B2 | 4/2016 | Grumbine et al. | |
| 9,303,189 B2 | 4/2016 | Grumbine et al. | |
| 9,303,190 B2 | 4/2016 | Ward et al. | |
| 9,309,442 B2 | 4/2016 | Fu et al. | |
| 9,422,456 B2 | 8/2016 | Grumbine et al. | |
| 9,422,457 B2 | 8/2016 | Grumbine et al. | |
| 9,556,363 B2 | 1/2017 | Fu et al. | |
| 2015/0267083 A1* | 9/2015 | Ward .................. | C09G 1/02 438/693 |
| 2015/0322294 A1* | 11/2015 | Onishi ............... | H01L 21/3212 451/59 |
| 2016/0289500 A1 | 10/2016 | Belmont | |
| 2017/0190936 A1* | 7/2017 | Dockery .............. | C09K 13/00 |
| 2018/0043497 A1* | 2/2018 | Hanano ............... | B24B 37/00 |

FOREIGN PATENT DOCUMENTS

WO     2016/143797     * 9/2016

OTHER PUBLICATIONS

Korean Intellectual Property Office, International Search Report and Written Opinion of the International Searching Authority issued in connection with PCT/US2019/061253 dated Mar. 10, 2020.

* cited by examiner

*Primary Examiner* — Stephanie P Duclair
(74) *Attorney, Agent, or Firm* — Thomas Omholt; Erika R. Singleton; Daniel C. Schulte

(57) ABSTRACT

A chemical mechanical polishing composition for polishing a substrate includes a liquid carrier and cationic metal oxide abrasive particles dispersed in the liquid carrier. The cationic metal oxide abrasive particles have a surface modified with at least one compound consisting of a silyl group having at least one quaternary ammonium group. A method for chemical mechanical polishing a substrate including a metal layer includes contacting the substrate with the above described polishing composition, moving the polishing composition relative to the substrate, and abrading the substrate to remove a portion of the metal layer from the substrate and thereby polish the substrate.

21 Claims, No Drawings

COMPOSITION AND METHOD FOR METAL CMP

BACKGROUND OF THE INVENTION

Tungsten plug and interconnect and copper interconnect and dual damascene processes are back end of line (BEOL) processes that have long been employed to form the network of metal wires that connect the transistors in a conventional semiconductor device. In these processes metal layers are deposited in openings formed in a dielectric material (e.g., TEOS). Chemical mechanical polishing (CMP) is used to remove the excess metal from the dielectric and thereby form conductive plugs and/or interconnects therein. An interlayer dielectric (ILD) material (such as TEOS) is deposited between metal interconnect levels to provide electrical insulation between the levels.

As semiconductor device feature sizes continue to shrink, meeting local and global planarity requirements has become increasingly difficult in CMP operations (particularly in metal CMP operations). Array erosion (also referred to as oxide erosion) and plug and line recessing (also referred to as dishing) are known to compromise planarity and overall device integrity. Moreover, local metal loss may cause electrical contact problems that can degrade electrical performance. There is a need in the industry for metal CMP slurries (or compositions) that provide for improved planarity (particularly reduced metal loss) during metal CMP operations.

Furthermore, cobalt is emerging as a leading candidate to replace the tantalum/tantalum nitride barrier stack in certain copper interconnect applications and is also being investigated as a replacement for tungsten metal in certain BEOL applications. With the potential introduction of cobalt as a copper barrier layer and/or as a tungsten plug and/or tungsten interconnect replacement, there is an emerging need for CMP slurries that are able to efficiently planarize cobalt containing substrates.

BRIEF SUMMARY OF THE INVENTION

Chemical mechanical polishing compositions are disclosed that comprise, consist essentially of, or consist of a liquid carrier and cationic metal oxide abrasive particles dispersed in the liquid carrier. In a first embodiment, the abrasive particles have a surface modified with at least one compound comprising, consisting essentially of or consisting of a silyl group represented by general formula (1):

$$—Si(X)_n\text{-}[L\text{-}O\text{-}R\text{-}A]_{3-n} \quad (1)$$

wherein X is the same or different and each represents a hydroxyl group, a hydrolyzable substituent, a non-hydrolyzable substituent, or a bond with an O—Si of another silyl group or the particle; n is 0, 1, or 2; L is a linkage group; O is an oxygen heteroatom; R is an alkyl group that contains an amino group, a hydroxyl group, or an unsaturated bond; and A is a quaternary ammonium group. In this first embodiment, the liquid carrier is preferably water or water based and the metal oxide abrasive particles preferably have a mean particle size in a range from about 30 to about 90 nm.

In a second embodiment, the abrasive particles have a surface modified with at least one compound comprising, consisting essentially of or consisting of a silyl group represented by general formula (2) or general formula (3):

$$—Si(X)_n\text{-}[L\text{-}CR^1(OH)\text{—}C(R^2)_2\text{-}A]_{3-n} \quad (2)$$

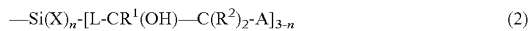

wherein X is the same or different and each represents a hydroxyl group, a hydrolyzable substituent, a non-hydrolyzable substituent, or a bond with an O—Si of another silyl group or the particle; n is 0, 1, or 2; L is a linkage group; $R^1$ is a hydrogen atom or an alkyl group that contains an amino group, a hydroxyl group, or an unsaturated bond; $R^2$ is the same or different, and each represents a hydrogen atom or an alkyl group that contains an amino group, a hydroxyl group, or an unsaturated bond; and A is a quaternary ammonium group;

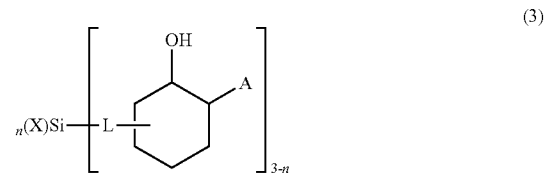

(3)

wherein X' is the same or different and each represents a hydroxyl group, a hydrolyzable substituent, a non-hydrolyzable substituent, or a bond with an O—Si of another silyl group or the particle; n' is 0, 1, or 2; L' is a linkage group; and A' is a quaternary ammonium group. In this second embodiment, the metal oxide abrasive particles may preferably have an aggregation ratio in a range from about 1.5 to about 5.0.

Methods for chemical mechanical polishing a substrate including a metal layer are further disclosed. These methods may include contacting the substrate with the above described polishing composition embodiments, moving the polishing composition relative to the substrate, and abrading the substrate to remove a portion of the cobalt from the substrate and thereby polish the substrate. The methods may further comprise removing a portion of a dielectric layer from the substrate.

DETAILED DESCRIPTION OF THE INVENTION

A chemical mechanical polishing composition for polishing a substrate having a metal layer is disclosed. In one embodiment, the polishing composition comprises, consists essentially of, or consists of a liquid carrier and cationic metal oxide abrasive particles dispersed in the liquid carrier. The abrasive particles may have a surface modified with at least one compound comprising, consisting essentially of or consisting of a silyl group represented by the general formula (1):

$$—Si(X)_n\text{-}[L\text{-}O\text{-}R\text{-}A]_{3-n} \quad (1)$$

wherein X is the same or different and each represents a hydroxyl group, a hydrolyzable substituent, a non-hydrolyzable substituent, or a bond with an O—Si of another silyl group or the particle; n is 0, 1, or 2; L is a linkage group; O is an oxygen heteroatom; R is an alkyl group that contains an amino group, a hydroxyl group, or an unsaturated bond; and A is a quaternary ammonium group. The liquid carrier may be water based and the metal oxide abrasive particles may have a mean particle size in a range from about 30 to about 90 nm. Moreover, the abrasive particles may have an aggregation ratio in a range from about 1.5 to about 5.0.

It will be appreciated that the disclosed CMP compositions may be advantageously utilized for substantially any CMP operation in which a metal layer is removed (or partially removed) from a substrate. For example, the disclosed CMP compositions may be used for bulk metal removal and/or CMP buff operations. Bulk removal operations may require higher metal removal rates while buff operations may require lower defect levels and/or more stringent corrosion control. The disclosed CMP compositions may also be advantageously utilized for a single-step CMP operation. While the disclosed embodiments may be particularly well suited for buff operations, they are not intended to be limited to any particular CMP operation.

The polishing composition contains an abrasive including metal oxide particles suspended in a liquid carrier. The abrasive may include substantially any suitable metal oxide particles known in the art having surface hydroxide groups that are accessible for reaction with silane modifying agents. For example, the metal oxide can be alumina, titania, zirconia, germania, silica, ceria, tantalum oxide (TaOx), mixtures thereof, and chemical admixtures thereof (i.e., particles including atomically mixed or coated metal oxide mixtures). Preferably, the metal oxide abrasive is silica (silicon dioxide), including fumed silica and colloidal silica. As used herein the term colloidal silica particles refers to silica particles that are prepared via a wet process rather than a pyrogenic or flame hydrolysis process which commonly produces structurally different particles. Such colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes.

Colloidal silica may be precipitated or condensation-polymerized silica, which may be prepared using any method known to those of ordinary skill in the art, such as by the sol gel method or by silicate ion-exchange. Condensation-polymerized silica particles are often prepared by condensing Si(OH)$_4$ to form substantially spherical particles. The precursor Si(OH)$_4$ may be obtained, for example, by hydrolysis of high purity alkoxysilanes, or by acidification of aqueous silicate solutions. Such abrasive particles may be prepared, for example, in accordance with U.S. Pat. No. 5,230,833 or may be obtained from any of a number of commercial suppliers, for example, including EKA Chemicals, Fuso Chemical Company, Nalco, DuPont, Bayer, Applied Research, Nissan Chemical, and Clariant.

Pyrogenic silica (fumed silica) is produced via a flame hydrolysis process in which a suitable feedstock vapor (such as silicon tetra-chloride) is combusted in a flame of hydrogen and oxygen. Molten particles of roughly spherical shapes are formed in the combustion process, the diameters of which may be varied via process parameters. These molten spheres, commonly referred to as primary particles, fuse with one another by undergoing collisions at their contact points to form branched, three dimensional chain-like aggregates. Fumed silica abrasives are commercially available from a number of suppliers including, for example, Cabot Corporation, Evonic, and Wacker Chemie.

The modified metal oxide particles preferably include colloidal silica and more preferably include aggregated colloidal silica particles. As is known to those of ordinary skill in the art, non-aggregated particles are individually discrete particles that may be spherical or nearly spherical in shape, but can have other shapes as well (such as generally elliptical, square, or rectangular cross-sections). These non-aggregated particles are referred to as primary particles. Aggregated particles are particles in which multiple discrete particles (primary particles) have clustered or bonded together to form aggregates having generally irregular shapes.

Metal oxide particle aggregation may be quantified using an aggregation ratio which is defined herein as the average particle size of the aggregated particle divided by the average diameter of the primary particle. In determining the aggregation ratio, the average particle size of the aggregated particle is determined using a dynamic light scattering tool (e.g., the Zetasizer® available from Malvern® Instruments) while the average diameter of the primary particle is determined via scanning or transmission electron microscopy (SEM or TEM). Suitable aggregated metal oxide particles may have an aggregation ratio of about 1.5 or more (e.g., about 2 or more or about 2.5 or more). The aggregated particles may have an aggregation ratio of about 10 or less (e.g., about 8 or less, or about 6 or less, or about 5 or less, or about 4.5 or less). It will thus be understood that the aggregated particles may have an aggregation ratio in a range bounded by any two of the aforementioned endpoints. For example, the aggregated particles may have an aggregation ratio in a range from about 1.5 nm to about 10 (e.g., from about 1.5 to about 8, from about 1.5 to about 6, from about 1.5 to about 5, from about 2 to about 5, or from about 2 to about 4.5).

The modified metal oxide particles include the metal oxide having attached at least one silyl group, which is a silicon-containing group that is attached to the metal oxide surface at the silicon atom of the silicon-containing group. The silyl group can be attached to a portion of the surface of the metal oxide through one or more covalent bonds, one or more electrostatic bonds (e.g., one or more ionic bonds), one or more hydrogen bonds, one or more van der waals bonds, or combinations thereof. Preferably, the silyl group is attached to a portion of the surface of the metal oxide particle through one or more covalent bonds.

In one embodiment, the silyl group may be represented by general formula (1):

$$-\text{Si}(X)_n\text{-[L-O-R-A]}_{3-n} \qquad (1)$$

where n is 0, 1, or 2 and X is the same or different and each represents a hydroxyl group, a hydrolyzable substituent, a non-hydrolyzable substituent, or a bond with an O—Si of another silyl group or the particle. As used herein, the term "hydrolyzable" refers to substituents that will form an Si—OH group in an aqueous system, such as an alkoxy group. The term "non-hydrolyzable" refers to substituents that do not undergo hydrolysis to form an Si—OH group in an aqueous solution. Suitable examples include alkyl groups, cycloalkyl groups, aromatic groups, or alkenyl groups, which can each be further substituted with one or more functional groups.

In formula (1), L is a linkage group that links the silicon atom to the oxygen heteroatom 0. L may be substantially any branched or unbranched alkylene (such as methylene, ethylene, or propylene), alkenylene, or alkynylene group or an arylene, heteroarylene, alkylarylene, or arylalkylene group. L may also include additional functional groups, such as hydroxyl or alkoxy groups. R is an alkyl group that contains an amino group, a hydroxyl group, or an unsaturated bond and links the oxygen heteroatom to the quaternary ammonium group A. Example chemical groups include, but are not limited to —CO—, —CONR'—, —SO$_3$—, —SO$_2$—, —SO$_2$NR'—, —CH$_2$CH$_2$CO—, —CH$_2$CH$_2$COO—, —CH$_2$CH$_2$CONR'—, —CH$_2$CH(OH)—, —CH$_2$CH(OH) CH$_2$— and the like, wherein R' is a branched or unbranched, substituted or unsubstituted alkyl, alkenyl or alkynyl group or a substituted or unsubstituted aryl, heteroaryl, alkylaryl; or arylalkyl group.

In formula (1), the quaternary ammonium group A may include substantially any suitable quaternary ammonium compound such that A is —N$^+$R'R"R'" wherein R', R", and R'" may be the same or different and may include substantially any carbon containing compound. It will be understood that the n-ium group in the quaternary ammonium may have a structure corresponding to the structure of the tertiary amine as a raw material. For example, if the tertiary amine is triethylamine, the corresponding quaternary ammonium group is triethylammonium. The quaternary ammonium group may, for example, be one having a saturated hydrocarbon group (such as trimethylamine, triethylamine, dimethylethylamine, and the like), a hydroxyl group, an ether group, an amino group, and/or one having a hydrocarbon group containing an unsaturated carbon bond (such as dimethyl ethanolamine, dimethylaniline, diethylaniline, dimethylbenzylamine, pyridine, and the like).

Preferred quaternary ammonium groups may be the same or different and each represents a hydroxyl group, an amino group, a $C_1$-$C_{10}$ alkyl group which may be substituted with a phenyl group (preferably a $C_1$-$C_6$ alkyl group and more preferably a $C_1$-$C_3$ alkyl group). Example quaternary ammonium groups include —N$^+$(CH$_3$)$_3$, —N$^+$(C$_2$H$_5$)$_3$, —N$^+$(CH$_3$)$_2$(CH$_2$CH$_2$OH), —N$^+$(C$_2$H$_5$)$_2$(CH$_2$CH$_2$OH), —N$^+$(CH$_3$)$_2$(CH$_2$CH(OH)CH$_3$), and —N$^{++}$(CH$_3$)$_2$(CH$_3$)$_2$CH$_2$OH). The most preferred quaternary ammonium groups include —N$^+$(CH$_3$)$_3$, —N$^+$(C$_2$H$_5$)$_3$, and N$^+$(CH$_3$)$_2$(CH$_2$CH$_2$OH).

With further respect to formula (1), in one preferred embodiment, L is —CH$_2$CH$_2$CH$_2$—, R is —CH$_2$CH(OH)CH$_2$—, and A is —N$^+$R'R"R'" wherein R', R", and R'" may be the same or different and may include substantially any carbon containing compound and wherein A is preferably selected from —N$^+$(CH$_3$)$_3$, —N$^+$(C$_2$H$_5$)$_3$, —N$^+$(CH$_3$)$_2$(CH$_2$CH$_2$OH), —N$^+$(C$_2$H$_5$)$_2$(CH$_2$CH$_2$OH), —N$^+$(CH$_3$)$_2$(CH$_2$CH(OH)CH$_3$), and —N$^+$(CH$_3$)$_2$C[(CH$_3$)$_2$CH$_2$OH].

The silyl group may also be represented by general formula (2):

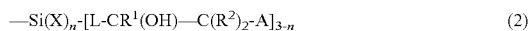

(2)

where n, X, and A are as defined above for formula (1). In formula 2, L is a linkage group that links the silicon atom to CR$^1$. As in formula (1), L may be substantially any branched or unbranched alkylene (such as methylene, ethylene, or propylene), alkenylene, or alkynylene group or an arylene, heteroarylene, alkylarylene, or arylalkylene group. L may also include additional functional groups, such as hydroxyl or alkoxy groups. R$^1$ and R$^2$ are the same or different, and each represents a hydrogen atom or an alkyl group that contains an amino group, a hydroxyl group, or an unsaturated bond.

With further respect to formula (2), in one preferred embodiment, L is —CH$_2$CH$_2$CH$_2$OCH$_2$—, R$^1$ and R$^2$ are H, and A is —N$^+$R'R"R'" wherein R', R", and R'" may be the same or different and may include substantially any carbon containing compound and wherein A is preferably selected from —N$^+$(CH$_3$)$_3$, —N$^+$(C$_2$H$_5$)$_3$, —N$^+$(CH$_3$)$_2$(CH$_2$CH$_2$OH), —N$^+$(C$_2$H$_5$)$_2$(CH$_2$CH$_2$OH), —N$^+$(CH$_3$)$_2$(CH$_2$CH(OH)CH$_3$), and —N$^+$(CH$_3$)$_2$C[(CH$_3$)$_2$CH$_2$OH].

The silyl group may also be represented by general formula (3):

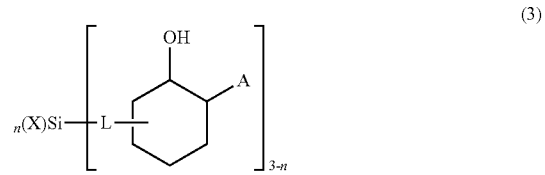

(3)

where n, X, and A are as defined above for formulas (1) and (2). In formula (3), L is a linkage group that links the silicon atom to the depicted heterocyclic group. As in formulas (1) and (2), L may be substantially any branched or unbranched alkylene (such as methylene, ethylene, or propylene), alkenylene, or alkynylene group or an arylene, heteroarylene, alkylarylene, or arylalkylene group. L may also include additional functional groups, such as hydroxyl or alkoxy groups.

With further respect to formula (3), in one preferred embodiment, L is —CH$_2$CH$_2$— and A is —N$^+$R'R"R'" wherein R', R", and R'" may be the same or different and may include substantially any carbon containing compound and wherein A is preferably selected from —N$^+$(CH$_3$)$_3$, —N$^+$(C$_2$H$_5$)$_3$, —N$^+$(CH$_3$)$_2$(CH$_2$CH$_2$OH), —N$^+$(C$_2$H$_5$)$_2$(CH$_2$CH$_2$OH), —N$^+$(CH$_3$)$_2$(CH$_2$CH(OH)CH$_3$), and —N$^+$(CH$_3$)$_2$C [(CH$_3$)$_2$CH$_2$OH].

As described in more detail below the modified metal oxide abrasive particles may be prepared as the combination product of a metal oxide having at least one surface metal hydroxide and at least one precursor silane compound having a reactive functional group that is subsequently reacted with a second treating agent to form the silyl group having formula (1), (2) or (3). When the silyl group has formula (2), the precursor silane may include 3-glycidoxymethyltrimethoxysilane, 3-glycidoxypropylmethyldimethoxysilane, 3-glycidoxypropylmethyldiethoxysilane, 3-glycidoxypropyldimethylmethoxysilane, 5,6-epoxyhexyltrimethoxysilane, 5,6-epoxyhexyltriethoxysilane, xylpropyldimethylethoxysilane with 3-glycidoxypropyltrimethoxysilane and 3-glycidoxypropyltriethoxysilane being preferred. When the silyl group has formula (3), the precursor silane may include (3, 4-epoxycyclohexyl) methyltrimethoxysilane, (3,4-epoxycyclohexyl) methyltriethoxysilane, 2-(3,4-epoxycyclohexyl) ethyltrimethoxysilane, 2-(3,4-d epoxycyclohexyl alkyl) (such as pentacyclohexyl) ethyltriethoxysilane, 2-(3, 4-epoxycyclohexyl) ethyltrimethoxysilane, and 2-(3,4-epoxycyclohexanexyl) ethyltriethoxysilane with 2-(3,4-epoxycyclohexyl) ethyltrimethoxysilane being preferred.

The modified metal oxide particles may have a positive charge in the polishing composition. The charge on dispersed particles such as silica particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). Accordingly, silica abrasive particles with a positive charge (i.e., cationic silica abrasive particles) will have a positive zeta potential at their operating pH. The zeta potential is typically dependent on the pH of the aqueous medium. For a given composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of dispersed abrasive particles, such as in the disclosed polishing compositions, may be obtained using commercially available instrumentation such as the Zetasizer available from Malvern Instruments, the ZetaPlus Zeta Potential Analyzer available from Brookhaven Instruments, and/or an electro-acoustic spectrometer available from Dispersion Technologies, Inc.

In certain embodiments, the modified metal oxide particles may comprise silica particles (e.g., colloidal silica particles) having an isoelectric point greater than pH 7. For example, the silica abrasive particles may have an isoelectric point greater than pH 8 (e.g., greater than pH 8.5 or greater than pH 9).

In certain embodiments, the modified metal oxide abrasive particles may comprise silica particles having a zeta potential of about 10 mV or more (e.g., about 15 mV or more, about 20 mV or more, about 25 mV or more, or about 30 mV or more) in the polishing composition (e.g., at a pH greater than about 6 or at a pH in a range from about 6 to about 8). The silica abrasive particles may have a zeta potential of about 50 mV or less (e.g., about 45 mV or less or about 40 mV or less) in the polishing composition (e.g., at a pH greater than about 6 or at a pH in a range from about 6 to about 8). It will be understood that the silica abrasive particles may have a zeta potential in a range bounded by any two of the aforementioned endpoints. For example, the silica abrasive particles may have a zeta potential in a range from about 10 mV to about 50 mV (e.g., about 10 mV to about 45 mV, or about 20 mV to about 40 mV) in the polishing composition (e.g., at a pH greater than about 6 or at a pH in a range from about 6 to about 8).

It will be understood that the modified metal oxide abrasive particles generally have a permanent positive charge. By permanent positive charge it is meant that the positive zetal potential on the silica particles is not readily reversible, for example, via flushing, dilution, filtration, and the like. A permanent positive charge may be the result, for example, of covalently bonding a cationic compound with the colloidal silica. A permanent positive charge is in contrast to a reversible positive charge that may be the result, for example, of an electrostatic interaction between a cationic compound and the metal oxide abrasive.

The modified metal oxide abrasive particles may have substantially any suitable particle size in the CMP composition. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, La.) or the Zetasizer® available from Malvern Instruments®. The abrasive particles may have an average particle size of about 5 nm or more (e.g., about 10 nm or more, about 20 nm or more, about 30 nm or more, or about 40 nm or more). The abrasive particles may have an average particle size of about 200 nm or less (e.g., about 150 nm or less, about 100 nm or less, about 90 nm or less, about 80 nm or less, about 70 nm or less, or about 60 nm or less). It will thus be understood that the abrasive particles may have an average particle size in a range bounded by any two of the aforementioned endpoints. For example, the abrasive particles may have an average particle size in a range from about 5 nm to about 200 nm (e.g., from about 10 nm to about 150 nm, from about 20 nm to about 100 nm, from about 30 nm to about 90 nm, or from about 40 nm to about 60 nm).

When the modified metal oxide abrasive particles include aggregated particles, the aggregated particles may have substantially any suitable primary particle size. The primary particle size is defined herein as an average diameter of the primary particles as determined via scanning or transmission electron microscopy (SEM or TEM). The abrasive particles may have a primary particle size in a range from about 10 to about 40 nm (e.g., from about 15 to about 35 nm or from about 20 to about 30 nm).

The polishing composition may include substantially any suitable amount of the abrasive particles. If the polishing composition comprises too little abrasive, the composition may not exhibit a sufficiently high CMP removal rate. In contrast, if the polishing composition comprises too much abrasive, the polishing composition may exhibit undesirable polishing performance and/or may not be cost effective and/or may lack colloidal stability. The polishing composition may include about 0.01 wt. % or more abrasive particles (e.g., about 0.05 wt. % or more). The polishing composition may include about 0.1 wt. % or more (e.g., about 0.2 wt. % or more, about 0.3 wt. % or more, or 0.5 wt. % or more) abrasive particles. The concentration of abrasive particles in the polishing composition is generally less than about 20 wt. %, and more typically about 10 wt. % or less (e.g., about 5 wt. % or less, about 3 wt. % or less, about 2 wt. % or less, or about 1.5 wt. % or less, or about 1 wt. % or less). It will be understood that the abrasive particles may be present in the polishing composition at a concentration bounded by any two of the aforementioned endpoints. For example, the concentration of abrasive particles in the polishing composition may be in a range from about 0.01 wt. % to about 20 wt. %, and more preferably from about 0.05 wt. % to about 10 wt. % (e.g., from about 0.1 wt. % to about 5 wt. %, from about 0.1 wt. % to about 3 wt. %, from about 0.1 wt. % to about 2 wt. %, from about 0.2 wt. % to about 2 wt. %, from about 0.2 wt. % to about 1.5 wt. %, or from about 0.2 wt. % to about 1 wt. %,).

The modified metal oxide abrasive particles may be prepared using substantially any suitable known method. For example, the modified abrasive may be the combination product of a metal oxide and a silane compound, which can be considered to be a treating agent for the metal oxide. Suitable classes of silane compounds that can be used include alkoxysilanes, silazanes, halosilanes, and carboxysilanes (such as acetoxysilanes). For example, the silane modified metal oxide may be the combination product of a metal oxide having at least one surface metal hydroxide and at least one silane compound having the formula Y—F and partially hydrolyzed derivatives thereof. In this formula, F represents formula (1), (2), or (3) described above. Y is —OH or a hydrolyzable substituent. Suitable examples of hydrolyzable substituents for Y include, but are not limited to, alkoxy groups, halogens (such as a Cl group), carboxylates (such as an acetate group), amines, and amides.

Alternatively, the modified metal oxide abrasive particles may be prepared as the combination product of a metal oxide having at least one surface metal hydroxide and at least one precursor silane compound having a reactive functional group that is subsequently reacted with a second treating agent to form the silyl group having formula (1), (2) or (3). For example only, the silane modified metal oxide may be the combination product of a metal oxide having at least one surface metal hydroxide and at least one precursor silane compound having the formula $Y-Si(X)_n\text{-}(L\text{-}O-Z)_{3-n}$ and partially hydrolyzed derivatives thereof, which is subsequently reacted with a compound having the formula $NR_3$ to form the silane modified metal oxide having the attached silyl groups described above in formulas 1 and/or 2. In this formula Y, X, n, L, and O are as defined above and R is the same or different and may include, for example, an alkyl group. Z is an electrophilic chemical group that reacts with the nucleophilic $NR_3$ to bond a quaternary amine group to the silane. As specific examples, Z' may be an epoxide group, an alpha, beta-unsaturated carbonyl group, or a carboxylic acid derivative.

As described above, the modified metal oxide abrasive particles are dispersed in a liquid carrier. The liquid carrier is used to facilitate the application of the abrasive and any optional chemical additives to the surface of the substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The colloidal silica dispersion used to formulate the polishing composition may be processed via anion and/or cation exchange to remove various ionic compounds from the liquid carrier. For example, anion exchange may be used to remove chloride and other undesirable anions while cation exchange may be used to remove silicon species originating from the silane and/or base catalyst. In certain embodiments, anion and/or cation exchange may be used prior to the adding optional additives and chemical compounds to the dispersion. In one example embodiment, a 10 weight percent colloidal silica dispersion may first be passed through an ion exchange column containing an anion exchange resin such as Dowex® 550A (OH—). The resulting dispersion may be pH adjusted using nitric acid and diluted to 5 weight percent solids to minimize silica agglomeration. This resulting dispersion may then be passed through a column containing a cation exchange resin such as Dowex® 650C (H+). The resulting ion exchanged dispersion may then be used to formulate the polishing composition (e.g., via dilution, pH adjustment, and/or adding various additives and/or chemical compounds).

In certain embodiments, a polishing composition prepared using an ion exchange processed colloidal silica dispersion may be have a total dissolved silicon concentration of less than about 250 ppm by weight (e.g., less than about 200 ppm or less than about 150 ppm). The polishing composition may additionally and/or alternatively have a residual silane concentration of less than about 200 ppm (e.g., less than about 150 ppm or less than about 100 ppm).

Chemical mechanical polishing compositions in accordance with the present invention may be used to planarize substantially any metal containing substrate, for example, a semiconductor substrate including a copper layer, a copper barrier layer such as tantalum and/or tantalum nitride, a tungsten layer, a tungsten barrier layer such as titanium and/or titanium nitride, and/or a cobalt layer. The CMP composition may include substantially any additives suitable for polishing such metal layers.

The polishing composition may optionally further include an oxidizing agent. The oxidizing agent may be added to the polishing composition during the slurry manufacturing process or just prior to the CMP operation (e.g., in a tank located at the semiconductor fabrication facility). In certain applications (e.g., Cobalt CMP operations) an oxidizing agent may not be required.

In certain other applications (e.g., Tungsten and Copper CMP operations) an oxidizer may preferably include inorganic or organic per-compounds. A per-compound as defined herein is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($S_2O_8^=$), and sodium peroxide. Examples of compounds containing an element in its highest oxidation state include but are not limited to periodic acid, periodate salts, perbromic acid, perbromate salts, perchloric acid, perchlorate salts, perboric acid, and perborate salts and permanganates. The most preferred oxidizing agent is hydrogen peroxide.

The oxidizing agent may be present in the polishing composition in an amount ranging, for example, from about 0.1 to about 10 weight percent. In preferred embodiments in which a hydrogen peroxide oxidizer is used, the oxidizer may be present in the polishing composition in an amount ranging from about 0.1 to about 5 weight percent (e.g., from about 0.1 to about 4 weight percent, from about 0.1 to about 3 weight percent, from about 0.2 to about 4 percent, from about 0.2 to about 2 weight percent, from about 0.4 to about 4 percent, or from about 0.5 to about 3 percent).

Per-compounds (including hydrogen peroxide and its adducts) are known to sometimes chemically react with other compounds in the polishing composition (e.g., triazole compounds for inhibiting cobalt and copper etch). Elimination of such per-compounds may therefore improve the chemical stability and the pot life of the polishing composition. The polishing composition may therefore optionally (but not necessarily) include an oxidizing agent that does not include a per compound (a non per compound oxidizing agent). Such a non per compound oxidizing agent may be selected from nitrogen containing organic oxidizers such as a nitro compound, a nitroso compound, an N-oxide compound, an oxime compound, and combinations thereof. For example, the optional oxidizing agent may include an aryl nitro compound, an aryl nitroso compound, an aryl N-oxide compound, an aryl oxime compound, a heteroaryl nitro compound, a heteroaryl nitroso compound, a heteroaryl N-oxide compound, a heteroaryl oxime compound, and combinations thereof.

CMP compositions configured for polishing tungsten containing substrates may optionally include an iron containing accelerator for increasing the removal rate of tungsten during a tungsten CMP operation. The iron containing accelerator may include a soluble iron containing catalyst such as is disclosed in U.S. Pat. Nos. 5,958,288 and 5,980,775. Such an iron containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, acetylacetonates, citrates, gluconates, malonates, oxalates, phthalates, and succinates, and mixtures thereof. An iron containing accelerator may also include an iron containing activator (e.g., a free radical producing compound) or an iron containing catalyst associated with (e.g., coated or bonded to) the surface of the colloidal silica particle such as is disclosed in U.S. Pat. Nos. 7,029,508 and 7,077,880.

The amount of iron containing accelerator in the polishing composition may be varied depending upon the oxidizing agent used, if present, (optional oxidizing agents are disclosed in more detail below) and the chemical form of the accelerator. When the preferred oxidizing agent hydrogen peroxide (or its analogs) is used and a soluble iron containing catalyst is used (such as ferric nitrate), the catalyst may be present in the composition in an amount sufficient to provide a range from about 0.1 to about 3000 ppm Fe based on the total weight of the composition. The polishing composition preferably includes about 1 ppm Fe or more (e.g., about 5 ppm or more or about 10 ppm or more). The polishing composition preferably includes about 100 ppm Fe or less (e.g., about 50 ppm or less or about 30 ppm or less). It will thus be understood that the polishing composition may include a range of Fe levels bounded by any two of the aforementioned endpoints. For example, the polishing composition may include a range from about 1 to about 100 ppm Fe (e.g., from about 5 to about 50 ppm, or from about 10 to about 30 ppm).

Embodiments of the polishing composition including an iron containing accelerator may further include a stabilizer. Without such a stabilizer, the iron containing accelerator and the oxidizing agent, if present, may react in a manner that degrades the oxidizing agent rapidly over time. Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. The term "acid" as it is used herein to describe useful stabilizers also means the conjugate base of the acid stabilizer. For example the term "adipic acid" means adipic acid and its conjugate base. Stabilizers can be used alone or in combination and significantly decrease the rate at which oxidizing agents such as hydrogen peroxide decompose.

Preferred stabilizers include phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. The preferred stabilizers may be added to the compositions of this invention in an amount ranging from about 1 equivalent per iron containing accelerator to about 3.0 weight percent or more (e.g., from about 3 to about 10 equivalents). As used herein, the term "equivalent per iron containing accelerator" means one molecule of stabilizer per iron ion in the composition. For example 2 equivalents per iron containing accelerator means two molecules of stabilizer for each catalyst ion.

CMP compositions configured for polishing copper and/or copper barrier containing substrates may further include a copper complexing agent (also referred to as a chelating agent). Such chelating agents tend to react with (e.g., chemically bind) copper ions (and other copper compounds) in solution and therefore may in certain compositions function as copper polishing accelerators. Substantially any suitable copper complexing agent may be utilized. For example, the copper complexing agent may include a polycarboxylic acid (or conjugate base), a poly phosphonic acid or conjugate base, an amino acid, and/or a polyamine complex. Copper complexing agents are described in more detail in commonly assigned U.S. Pat. No. 9,556,363, which is fully incorporated by reference herein.

The polishing composition may optionally further include a metal etch inhibitor. Suitable inhibitor compounds inhibit the conversion of solid metal into soluble metal compounds while at the same time allowing for effective removal of the metal via the CMP operation. When the polishing composition is used for polishing tungsten, the composition may include a compound that inhibits tungsten etching. Classes of compounds that are useful inhibitors of tungsten etching include compounds having nitrogen-containing functional groups such as nitrogen-containing heterocycles, alkyl ammonium ions, amino alkyls, and amino acids. Useful amino alkyl corrosion inhibitors include, for example, hexylamine, tetramethyl-p-phenylene diamine, octylamine, diethylene triamine, dibutyl benzylamine, aminopropylsilanol, aminopropylsiloxane, dodecylamine, mixtures thereof, and synthetic and naturally occurring amino acids including, for example, lysine, tyrosine, glutamine, glutamic acid, cystine, and glycine (aminoacetic acid). The inhibitor compound may alternatively and/or additionally include an amine compound in solution in the liquid carrier. Suitable amine compounds are disclosed in commonly assigned U.S. Pat. Nos. 9,238,754; 9,303,188; and 9,303,189, each of which is fully incorporated by reference herein.

CMP compositions configured for polishing copper or copper barrier layers may include a compound that inhibits copper etching. The copper polishing inhibitor may include a film forming agent that is capable of facilitating the formation of a passive layer and therefore inhibiting copper etching. Such a compound may include a cyclic group such as an azole compound. Example azole compounds include imidazole, benzotriazole, benzimidazole and benzothiazole and their derivatives with hydroxy, amino, imino, carboxy, mercapto, nitro and alkyl substituted groups.

A copper polishing inhibitor may alternatively and/or additionally include anionic and/or amphoteric surfactants having a carbon chain length of six or more carbon atoms with the carbon chain preferably being an alkyl group 10 or more carbon atoms. Suitable compounds include, for example, Rhodafac® phosphated surfactants (Rhodia Inc.), Adeka REASOAP® sulfonic surfactants, Amisoft® zwitterionic surfactants, Mirataine® zwitterionic surfactants, Perlastan® zwitterionic surfactants (Struktol®), Hostapur® sulfonic surfactants, and Dowfax® sulfonic surfactants.

CMP compositions configured for polishing copper or copper barrier layers or cobalt layers may include a triazole compound that inhibits cobalt and/or copper etching. Preferred triazole compounds include triazole pyridine (TAP) compounds such as 1H-1,2,3-Triazolo[4,5,b] pyridine, 1-Acetyl-1H-1,2,3-triazolo[4,5,b] pyridine, 3H-[1,2,3]Triazolo[4,5-c] pyridine, and 2-(1,2,4-Triazol-3-yl) pyridine. The most preferred cobalt inhibitor is 1H-1,2,3-Triazolo[4,5,b] pyridine.

The chemical mechanical polishing composition may have substantially any suitable pH. For example, CMP compositions configured for polishing tungsten generally have an acidic pH in a range from about 1 to about 6 (e.g., from about 2 to about 5 or from about 2 to about 4). CMP compositions configured for polishing copper, copper barrier, and/or cobalt layers generally neutral having a pH in a range from about 5 to about 9 (e.g., from about 6 to about 9, from about 6 to about 8, from about 6.5 to about 8, from about 7 to about 8.5, or from about 7 to about 8). The pH of the polishing composition may be achieved and/or maintained by any suitable means. The polishing composition may include substantially any suitable pH adjusting agents or buffering systems. For example, suitable pH adjusting agents may include nitric acid, sulfuric acid, phosphoric acid, and the like as well as organic acids such as acetic acid and lactic acid. Suitable buffering agents may include phosphates, ammonium salts, and the like.

The polishing composition may optionally further include a biocide. The biocide may include any suitable biocide, for example an isothiazolinone biocide such as Kordek® biocides available from Dow Chemical Company. The polishing composition may include substantially any suitable amount of biocide. For example, certain embodiments may include from about 1 to about 1000 ppm of the biocide, for example, from about 10 to about 500 ppm. The disclosed embodiments are explicitly not limited to the use of any particular biocide compound or concentration.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the abrasive particles, the cobalt inhibitor, etc.)

For example, a treated colloidal silica dispersion may be prepared as described above to promote bonding of the silane compound to the colloidal silica. Other chemical compounds such as an inhibitor, a catalyst, a stabilizer, and a biocide may then be added and mixed by any method that is capable of incorporating the components into the polishing composition. The polishing composition also may also be prepared by mixing the components at the surface of the substrate (e.g., on the polishing pad) during the CMP operation.

The polishing composition of the invention may also be provided as a concentrate which is intended to be diluted with an appropriate amount of water prior to use. In such an embodiment, the polishing composition concentrate may include the abrasive particles (e.g., the treated colloidal silica), any other optional chemical compounds, and water, in amounts such that, upon dilution of the concentrate with an appropriate amount of water, each component of the polishing composition will be present in the polishing composition in an amount within the appropriate range recited above for each component. For example, the abrasive particles and other optional chemical compounds may be present in the polishing composition in an amount that is about 2 times (e.g., about 3 times, about 4 times, about 5 times, or about 10 times) greater than the concentration recited above for each component so that, when the concentrate is diluted with an equal volume of (e.g., 1 equal volume of water, 2 equal volumes of water, 3 equal volumes of water, 4 equal volumes of water, or even 9 equal volumes of water respectively), each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

Although the polishing composition of the invention may be used to polish any substrate, the polishing composition is particularly useful for polishing a substrate comprising at least one metal layer, such as a tungsten layer, a copper layer, a copper barrier layer, or a cobalt layer. The substrate may further include a dielectric layer including a metal oxide such as a silicon oxide layer derived from tetraethyl orthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as metal and a dielectric material as described herein) to polish the substrate.

In certain embodiments, optimal planarization may be achieved when the polishing rates of the metal and the dielectric material are similar. For example, in certain embodiments the selectivity of cobalt to dielectric material may be in a range from about 1:10 to about 10 to 1 (e.g., from about 1:3 to about 3:1). In certain embodiments (particularly cobalt polishing applications), the polishing rate of the dielectric material may be greater than the polishing rate of cobalt such that the selectivity of cobalt to dielectric material may be less than 1:1 (e.g., in a range from 1:10 to about 1:1).

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The invention is further illustrated by the following embodiments.

Embodiment (1) presents a chemical mechanical polishing composition comprising: (i) a liquid carrier; (ii) cationic metal oxide abrasive particles dispersed in the liquid carrier, the cationic metal oxide abrasive particles having a surface modified with at least one compound comprising, consisting essentially of, or consisting of a silyl group represented by general formula (2) or general formula (3):

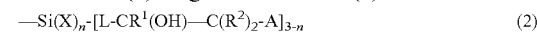

wherein X is the same or different and each represents a hydroxyl group, a hydrolyzable substituent, a non-hydrolyzable substituent, or a bond with an O—Si of another silyl group or the particle; n is 0, 1, or 2; L is a linkage group; $R^1$ is a hydrogen atom or an alkyl group that contains an amino group, a hydroxyl group, or an unsaturated bond; $R^2$ is the same or different, and each represents a hydrogen atom or an alkyl group that contains an amino group, a hydroxyl group, or an unsaturated bond; and A is a quaternary ammonium group;

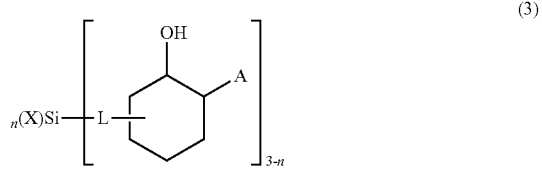

wherein X' is the same or different and each represents a hydroxyl group, a hydrolyzable substituent, a non-hydrolyzable substituent, or a bond with an O—Si of another silyl group or the particle; n' is 0, 1, or 2; L' is a linkage group; and A' is a quaternary ammonium group;

wherein the metal oxide abrasive particles have an aggregation ratio in a range from about 1.5 to about 5.0.

Embodiment (2) presents a composition according to embodiment (1), wherein (i) the silyl group is represented by the general formula (2); and (ii) L is —$CH_2CH_2CH_2OCH_2$—, $R^1$ and $R^2$ are H, and A is —$N^+R'R''R'''$ wherein R', R", and R''' may be the same or different and may include substantially any carbon containing compound.

Embodiment (3) presents a composition according to embodiment (1), wherein (i) the silyl group is represented by the general formula (3); and (ii) L is —$CH_2CH_2$— and A is —$N^+R'R''R'''$ wherein R', R", and R''' may be the same or different and may include substantially any carbon containing compound.

Embodiment (4) presents a composition according to any one of embodiments (1)-(3), wherein the liquid carrier is water.

Embodiment (5) presents a composition according to any one of embodiments (1)-(4), wherein the metal oxide abrasive particles are silica particles.

Embodiment (6) presents a composition according to any one of embodiments (1)-(5), wherein the metal oxide abrasive particles have a mean particle size in a range from about 30 to about 90 nm.

Embodiment (7) presents a composition according to any one of embodiments (1)-(6), having a pH from about 6 to about 8.

Embodiment (8) presents a composition according to any one of embodiments (1)-(7), wherein the cationic metal oxide abrasive particles have an isoelectric point greater than about 9.

Embodiment (9) presents a composition according to any one of embodiments (1)-(8), wherein the cationic metal oxide abrasive particles comprise colloidal silica particles having a zeta potential of at least 20 mV at a pH of greater than 6.

Embodiment (10) presents a composition according to any one of embodiments (1)-(9), comprising less than about 2 weight percent of the cationic metal oxide abrasive particles.

Embodiment (11) presents a composition according to any one of embodiments (1)-(10), wherein the liquid carrier has a total dissolved silicon concentration of less than about 150 ppm. 2

Embodiment (12) presents a composition according to any one of embodiments (1)-(11), wherein the liquid carrier has a residual silane concentration of less than about 100 ppm.

Embodiment (13) presents a composition according to any one of embodiments (1)-(12), further comprising a hydrogen peroxide oxidizer and a metal corrosion inhibitor.

Embodiment (14) presents a composition according to any one of embodiments (1)-(13), further comprising a triazole pyridine compound and having a pH in a range from about 6 to about 8.

Embodiment (15) presents method of chemical mechanical polishing a substrate including a metal layer, the method comprising: (a) contacting the substrate with any one of the polishing compositions presented in embodiments (1)-(14); (b) moving the polishing composition relative to the substrate; and (c) abrading the substrate to remove a portion of the metal layer from the substrate and thereby polish the substrate.

Embodiment (16) presents a method according to embodiment (15), wherein the metal comprises at least one of cobalt, copper, and tungsten.

Embodiment (17) presents a method according to embodiment (15), wherein the substrate further comprises a dielectric layer and wherein the abrading in (c) also removes a portion of the dielectric layer from the substrate.

Embodiment (18) presents a method according to embodiment (17), wherein a ratio of a removal rate of the metal in (c) to a removal rate of the dielectric in (c) is in a range from about 3:1 to about 1:3.

Embodiment (19) presents a method according to embodiment (17), wherein the metal comprises cobalt and a removal rate of the dielectric layer in (c) is greater than a removal rate of cobalt in (c).

Embodiment (20) presents a chemical mechanical polishing composition comprising: a liquid carrier; cationic metal oxide abrasive particles dispersed in the liquid carrier, the cationic metal oxide abrasive particles having a surface modified with at least one compound comprising, consisting essentially of, or consisting of a silyl group represented by the general formula (1):

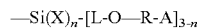

wherein X is the same or different and each represents a hydroxyl group, a hydrolyzable substituent, a non-hydrolyzable substituent, or a bond with an O—Si of another silyl group or the particle; n is 0, 1, or 2; L is a linkage group; O is an oxygen heteroatom; R is an alkyl group that contains an amino group, a hydroxyl group, or an unsaturated bond; and A is a quaternary ammonium group;

wherein the liquid carrier is water and the metal oxide abrasive particles have a mean particle size in a range from about 30 to about 90 nm.

Embodiment (21) presents a composition according to embodiment (20), wherein L is —$CH_2CH_2CH_2$—, R is —$CH_2CH(OH)CH_2$—, and A is —$N^+R'R''R'''$ wherein R', R", and R''' may be the same or different and may include substantially any carbon containing compound.

Embodiment (22) presents a composition according to one of embodiments (20) and (21), having a pH from about 6 to about 8 and wherein the wherein the cationic metal oxide abrasive particles comprise colloidal silica particles having a zeta potential of at least 20 mV.

Embodiment (23) presents a composition according to any one of embodiments (20)-(22), comprising less than about 2 weight percent of the metal oxide abrasive particles.

Embodiment (24) presents a composition according to any one of embodiments (20)-(23), wherein the liquid carrier has a total dissolved silicon concentration of less than about 150 ppm.

Embodiment (25) presents a composition according to any one of embodiments (20)-(24), wherein the liquid carrier has a residual silane concentration of less than about 100 ppm.

Embodiment (26) presents a composition according to any one of embodiments (20)-(25), further comprising a hydrogen peroxide oxidizer and a metal corrosion inhibitor.

Embodiment (27) presents a composition according to any one of embodiments (20)-(26), further comprising a triazole pyridine compound and having a pH in a range from about 6 to about 8.

Embodiment (28) presents a method of chemical mechanical polishing a substrate including a metal layer, the method comprising: (a) contacting the substrate with any one of the polishing compositions presented in embodiments (20)-(27); (b) moving the polishing composition relative to the substrate; and (c) abrading the substrate to remove a portion of the metal layer from the substrate and thereby polish the substrate.

Embodiment (29) presents a method according to embodiment (28), wherein the metal comprises at least one of cobalt, copper, and tungsten.

Embodiment (30) presents a method according to embodiment (28), wherein the substrate further comprises a dielectric layer and wherein the abrading in (c) also removes a portion of the dielectric layer from the substrate.

Embodiment (31) presents a method according to embodiment (30), wherein a ratio of a removal rate of the metal in (c) to a removal rate of the dielectric in (c) is in a range from about 3:1 to about 1:3.

Embodiment (32) presents a method according to embodiment (30), wherein the metal comprises cobalt and a removal rate of the dielectric layer in (c) is greater than a removal rate of cobalt in (c).

All references, including publications, patent applications, and patents, cited herein are hereby incorporated by reference to the same extent as if each reference were individually and specifically indicated to be incorporated by reference and were set forth in its entirety herein.

The following examples further illustrate the invention but, of course, should not be construed as in any way limiting its scope.

Example 1

A colloidal silica dispersion was prepared as follows. A mixture was prepared by stirring 160.2 grams of triethylamine into 9000 grams of a BS-2 colloidal silica dispersion. The BS-2 colloidal silica dispersion is available from Fuso Chemical Company, Ltd., Japan and includes 20 weight percent colloidal silica in water. This mixture was heated to 55 degrees C. A silane solution was prepared by adding 124.7 grams of 3-glycidyloxypropyltrimethoxysilane (GPTMS) to 499.1 grams of methanol. The silane solution was added to the above described mixture at a constant rate for 1 hour while maintaining the temperature of the mixture at 55 degrees C. The temperature of the mixture (including the added solution) was then held at 55 degrees C. for an additional 30 minutes prior to cooling to room temperature. A 31.3 gram measure of acetic acid was added to a 3450 gram sample of the cooled mixture. The pH of the resulting mixture was 6.5. The mixture was then distilled at ambient pressure to replace the methanol with 2000 grams of water to obtain a silane treated, cationic colloidal silica dispersion having 20 percent by weight of the cationic colloidal silica particles.

The average particle size of the silane treated, cationic colloidal prepared as described above was measured via dynamic light scattering to be 51 nm (using a Zetasizer® available from Malvern® Instruments). The average diameter of the primary particles was measured via SEM to be 24 nm (over an average of 50 particles). The true specific gravity was measured by dry solidifying the silane treated, cationic colloidal silica dispersion on a hot plate at 150 degrees C. and baking in a furnace at 300 degrees C. for 1 hour. The specific gravity was measured to be 2.1 grams/cm$^3$ via the liquid phase displacement method using ethanol.

Example 2

Twenty-five hundred grams of the silane treated, cationic colloidal silica dispersion prepared as described in Example 1 (and having 20 weight percent silica particles) was mixed with 2500 grams deionized water to obtain five kilograms of a diluted dispersion having 10 weight percent silica particles. This diluted dispersion was anion and cation exchanged as follows. The 5 kilogram sample was passed through 33 grams of Dowex® 550A (OH—) anion exchange resin. The resulting dispersion had a pH of about 11 with a conductivity of about 290 µS. The pH was immediately adjusted to 6.8 with nitric acid and additional water was added to further dilute the dispersion to 5 weight percent silica particles. This resulting dispersion (now weighing 10 kg) was then immediately passed through a column containing 25 grams Dowex® 650C (H+) cation exchange resin to obtain an ion (anion and cation) exchanged silane treated colloidal silica dispersion. The conductivity of the ion exchanged dispersion was about 196 µS.

Samples of the silane treated, cationic colloidal silica dispersion prepared as described in Example 1 (1A) and the ion exchanged dispersion described above (2A) were evaluated to determine total dissolved silicon and chloride ion concentrations. The samples were first centrifuged at 60,000 rpm for one hour to obtain corresponding supernates that were free of silica particles. The supernates were in turn evaluated using inductively coupled plasma (ICP) to obtain total dissolved silicon concentrations and ion chromatography (IC) to obtain and chloride ion concentrations. The results of the evaluation are set forth in Table 1.

TABLE 1

| Sample | Conductivity (µS) | Silicon (ppm) | Chloride (ppm) |
|---|---|---|---|
| 1A | 2184 | 602 | 797 |
| 2A | 196 | 104 | 1 |

As indicated in Table 1, anion and cation exchange reduced the total dissolved silicon concentration by about a factor of six. The chloride ion concentration was reduced to near zero.

Example 3

Zeta potential and isoelectric point were measured for the silane treated, cationic colloidal silica dispersion prepared as described in Example 1 (1A) and the ion exchanged dispersion prepared as described in Example 2 (2A). The zeta potential measurements were made using a Zetasizer available from Malvem Instruments. The results are set forth in Table 2.

TABLE 2

| | Zeta Potential (mV) | | | | Isoelectric |
|---|---|---|---|---|---|
| Sample | pH 6 | pH 7 | pH 8 | pH 9 | Point (pH) |
| 1A | 30 | 26 | 15 | 5 | 9.5 |
| 2A | 29 | 29 | 24 | 16 | 10.5 |

As indicated in Table 2, ion (anion and cation) exchange increases the zeta potential at pH values above about 7 and increases the isoelectric point (the pH at which the zeta potential is equal to zero).

Example 4

Four polishing slurries were prepared. The colloidal silica particle size was evaluated as a function of time for each.

Each of the four polishing slurries included 2 millimolar trizma (2-Amino-2-(hydroxymethyl)-1,3-propanediol), 0.15 weight percent benzotriazole, 125 ppm of a Kordek biocide, and 0.5 weight percent cationic colloidal silica particles. Comparative polishing compositions 4A and 4B included cationic colloidal silica particles prepared as described in Example 7 of U.S. Pat. No. 9,382,450. Inventive polishing compositions 4C and 4D included cationic colloidal silica particles prepared as described in Example 1. Polishing compositions 4A and 4C were adjusted to pH 7.1 using nitric acid. Polishing compositions 4B and 4D were adjusted to pH 7.6 using nitric acid. The slurries were aged 45 days at a constant temperature of 45 degrees C. The particle size measurements were made using a Zetasizer available from Malvern Instruments. The results are set forth in Table 3.

TABLE 3

| Polishing Composition | pH | Particle Size (nanometers) | | | | |
|---|---|---|---|---|---|---|
| | | Day 0 | Day 7 | Day 17 | Day 31 | Day 45 |
| 4A | 7.1 | 50 | 50 | 52 | 52 | 51 |
| 4B | 7.6 | 50 | 65 | 100 | 160 | na |
| 4C | 7.1 | 52 | 52 | 50 | 50 | 51 |
| 4D | 7.6 | 53 | 53 | 54 | 54 | 56 |

As indicated in Table 2, cationic colloidal silica particles prepared as described in Example 1 have a stable particle size of less than 60 nanometers during accelerated aging at 45 degrees C. These cationic colloidal silica particles exhibit improved stability at high pH (pH 7.6) as compared to the control cationic colloidal silica disclosed in Example 7 of U.S. Pat. No. 9,382,450.

Example 5

Three cobalt polishing compositions were prepared using cationic colloidal silica particles. Each polishing composition included 350 ppm benzotriazole and 0.5 weight percent cationic colloidal silica at a pH of 7.1 (adjusted using nitric acid). Comparative polishing composition 5A included cationic colloidal silica particles prepared as described in Example 7 of U.S. Pat. No. 9,382,450. Inventive polishing composition 5B included cationic colloidal silica prepared as described in Example 1 and inventive polishing composition 5C included cationic colloidal silica prepared as described in Example 2.

This example demonstrates the effectiveness of the inventive cationic colloidal silica particles in metal polishing applications. The blanket wafers included, cobalt, SiN, and TEOS wafers. The patterned wafer included a Silyb 854 mask with a Co, TiN, TEOS stack. Each patterned wafer was bulk polished 81 seconds to endpoint+20% using a composition similar to Example 1C in U.S. Pat. No. 9,834,704. The process used a Mirra® CMP polishing tool and a Cabot Microelectronics Corp E6088 polishing pad at a downforce of 1.5 psi, a platen speed of 83 rpm, and a head speed of 77 rpm. The slurry flow rate was 200 ml/min. The three cobalt polishing compositions described above were used to polish blanket and bulk polished patterned wafers. They were polished using a Mirra® CMP polishing tool and a Fujibo H7000 polishing pad at a downforce of 1.5 psi, a platen speed of 83 rpm, and a head speed of 77 rpm. The slurry flow rate was 200 ml/min.

Cobalt, SiN, and TEOS polishing rates were obtained using the blanket wafers. Blanket polish rates are set forth in Table 4. Pattern wafer topography was evaluated as a local metal loss using atomic force microscope (AFM) profilometer measurements across five distinct features: (i) a 50×50 micron feature, (ii) a 10×10 micron feature, (iii) a 7×3 micron feature, (iv) a 3×7 micron feature, and a (v) a 2×2 micron feature. The wafer topography results and polish times are set forth in Table 5.

TABLE 4

| Polishing Composition | Polishing Rate (A/min) | | |
|---|---|---|---|
| | Cobalt | SiN | TEOS |
| 5A | 98 | 20 | 232 |
| 5B | 93 | 72 | 229 |
| 5C | 69 | 80 | 223 |

TABLE 5

| Polishing Composition | Local Metal Loss (A) | | | | | Polish Time (sec) |
|---|---|---|---|---|---|---|
| | 50 × 50 μm | 10 × 10 μm | 7 × 3 μm | 3 × 7 μm | 2 × 2 μm | |
| 5A | 39 | 37 | 15 | 39 | 15 | 52 |
| 5B | 15 | 12 | 15 | 6 | 9 | 52 |
| 5C | 25 | 11 | 14 | 10 | 8 | 54 |

As indicated in Table 4, polishing compositions 5B and 5C including the inventive cationic colloidal silica particles exhibit higher SiN polishing rates such that the ratio of cobalt to SiN rates is nearly 1:1. This may result in improved topography for wafers including SiN layers. Moreover, inventive polishing compositions 5B and 5C exhibit significantly reduced local metal loss across a wide range of pattern features as compared to the control composition (5A).

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition comprising:
   a liquid carrier;
   cationic metal oxide abrasive particles dispersed in the liquid carrier, the cationic metal oxide abrasive particles having a surface modified with at least one compound comprising a silyl group represented by general formula (2) or general formula (3):

$$—Si(X)_n-[L-CR^1(OH)—C(R^2)_2-A]_{3-n} \quad (2)$$

wherein X is the same or different and each represents a hydroxyl group, a hydrolyzable substituent, a non-hydrolyzable substituent, or a bond with an O—Si of another silyl group or the particle;
   n is 0, 1, or 2;
   L is a linkage group;
   $R^1$ is a hydrogen atom or an alkyl group that contains an amino group, a hydroxyl group, or an unsaturated bond;
   $R^2$ is the same or different, and each represents a hydrogen atom or an alkyl group that contains an amino group, a hydroxyl group, or an unsaturated bond; and
   A is a quaternary ammonium group;

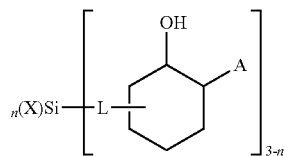

(3)

wherein X is the same or different and each represents a hydroxyl group, a hydrolyzable substituent, a non-hydrolyzable substituent, or a bond with an O—Si of another silyl group or the particle;
   n' is 0, 1, or 2;
   L' is a linkage group; and
   A' is a quaternary ammonium group;
   wherein the metal oxide abrasive particles have an aggregation ratio in a range from about 1.5 to about 5.0, and wherein the cationic metal oxide abrasive particles have an isoelectric point greater than about 9.

2. The composition of claim 1, wherein
   the silyl group is represented by the general formula (2); and
   L is —CH$_2$CH$_2$CH$_2$OCH$_2$—, $R^1$ and $R^2$ are H, and A is —N'R'R"R'" wherein R', R", and R'" are the same or different and include substantially any carbon containing compound.

3. The composition of claim 1, wherein
   the silyl group is represented by the general formula (3); and
   L is —CH$_2$CH$_2$— and A' is —N'R'R"R'" wherein R', R", and R'" are the same or different and include substantially any carbon containing compound.

4. The composition of claim 1, wherein the liquid carrier is water.

5. The composition of claim 1, wherein the metal oxide abrasive particles are silica particles.

6. The composition of claim 1, wherein the metal oxide abrasive particles have a mean particle size in a range from about 30 to about 90 nm.

7. The composition of claim 1, having a pH from about 6 to about 8.

8. The composition of claim 1, wherein the cationic metal oxide abrasive particles comprise colloidal silica particles having a zeta potential of at least 20 mV at a pH of greater than 6.

9. The composition of claim 1, comprising less than about 2 weight percent of the cationic metal oxide abrasive particles.

10. The composition of claim 1, wherein the liquid carrier has a total dissolved silicon concentration of less than about 150 ppm.

11. The composition of claim 1, wherein the liquid carrier has a residual silane concentration of less than about 100 ppm.

12. The composition of claim 1, further comprising a hydrogen peroxide oxidizer and a metal corrosion inhibitor.

13. A chemical mechanical polishing composition comprising:
    a liquid carrier;
    cationic metal oxide abrasive particles dispersed in the liquid carrier, the cationic metal oxide abrasive particles having a surface modified with at least one compound comprising a silyl group represented by general formula (2) or general formula (3):

$$—Si(X)_n-[L-CR^1(OH)—C(R^2)_2-A]_{3-n} \quad (2)$$

wherein X is the same or different and each represents a hydroxyl group, a hydrolyzable substituent, a non-hydrolyzable substituent, or a bond with an O—Si of another silyl group or the particle;
    n is 0, 1, or 2;
    L is a linkage group;
    $R^1$ is a hydrogen atom or an alkyl group that contains an amino group, a hydroxyl group, or an unsaturated bond;
    $R^2$ is the same or different, and each represents a hydrogen atom or an alkyl group that contains an amino group, a hydroxyl group, or an unsaturated bond; and
    A is a quaternary ammonium group;

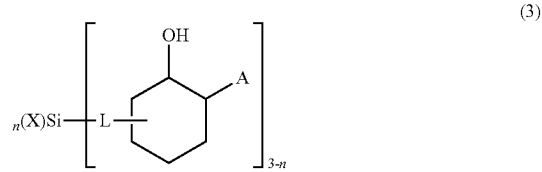

(3)

wherein X' is the same or different and each represents a hydroxyl group, a hydrolyzable substituent, a non-hydrolyzable substituent, or a bond with an O—Si of another silyl group or the particle;
    n' is 0, 1, or 2;
    L' is a linkage group; and
    A' is a quaternary ammonium group;
    wherein the metal oxide abrasive particles have an aggregation ratio in a range from about 1.5 to about 5.0, further comprising a triazole pyridine compound and having a pH in a range from about 6 to about 8.

14. A chemical mechanical polishing composition comprising:
a liquid carrier;
cationic metal oxide abrasive particles dispersed in the liquid carrier, the cationic metal oxide abrasive particles having a surface modified with at least one compound comprising a silyl group represented by the general formula:

—Si(X)$_n$-[L-O—R-A]$_{3-n}$     (1)

wherein X is the same or different and each represents a hydroxyl group, a hydrolyzable substituent, a non-hydrolyzable substituent, or a bond with an O—Si of another silyl group or the particle;
n is 0, 1, or 2;
L is a linkage group;
O is an oxygen heteroatom;
R is an alkyl group that contains an amino group, a hydroxyl group, or an unsaturated bond; and
A is a quaternary ammonium group;
wherein the liquid carrier is water and the metal oxide abrasive particles have a mean particle size in a range from about 30 to about 90 nm.

15. The composition of claim 14, wherein L is —CH$_2$CH$_2$CH$_2$—, R is —CH$_2$CH(OH)CH$_2$—, and A is —N$^+$R'R"R'" wherein R', R", and R'" are the same or different and include substantially any carbon containing compound.

16. The composition of claim 14, having a pH from about 6 to about 8 and wherein the wherein the cationic metal oxide abrasive particles comprise colloidal silica particles having a zeta potential of at least 20 mV.

17. The composition of claim 14, comprising less than about 2 weight percent of the metal oxide abrasive particles.

18. The composition of claim 14, wherein the liquid carrier has a total dissolved silicon concentration of less than about 150 ppm.

19. The composition of claim 14, wherein the liquid carrier has a residual silane concentration of less than about 100 ppm.

20. The composition of claim 14, further comprising a hydrogen peroxide oxidizer and a metal corrosion inhibitor.

21. The composition of claim 14, further comprising a triazole pyridine compound and having a pH in a range from about 6 to about 8.

* * * * *